United States Patent
Wang et al.

(10) Patent No.: US 12,114,427 B2
(45) Date of Patent: Oct. 8, 2024

(54) METHOD FOR FABRICATING ASSEMBLE SUBSTRATE

(71) Applicant: Siliconware Precision Industries Co., Ltd., Taichung (TW)

(72) Inventors: Lung-Yuan Wang, Taichung (TW); Wen-Liang Lien, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 211 days.

(21) Appl. No.: 17/831,301

(22) Filed: Jun. 2, 2022

(65) Prior Publication Data
US 2022/0304157 A1    Sep. 22, 2022

Related U.S. Application Data

(62) Division of application No. 16/589,663, filed on Oct. 1, 2019, now Pat. No. 11,382,214.

(30) Foreign Application Priority Data

Aug. 16, 2019 (TW) .................................. 108129257

(51) Int. Cl.
| | | |
|---|---|---|
| H05K 3/32 | (2006.01) | |
| H01L 23/31 | (2006.01) | |
| H05K 1/11 | (2006.01) | |
| H05K 1/14 | (2006.01) | |
| H05K 1/18 | (2006.01) | |
| H05K 3/46 | (2006.01) | |
| H05K 1/02 | (2006.01) | |

(52) U.S. Cl.
CPC ......... *H05K 1/144* (2013.01); *H01L 23/3157* (2013.01); *H05K 1/111* (2013.01); *H05K 1/181* (2013.01); *H05K 3/32* (2013.01); *H05K 3/4682* (2013.01); *H05K 1/0203* (2013.01); *H05K 2201/042* (2013.01)

(58) Field of Classification Search
CPC ........ H05K 1/144; H05K 1/111; H05K 1/181; H05K 3/32; H05K 3/4682; H05K 3/007; H05K 2201/2018; H01L 23/3157; H01L 21/6835; H01L 21/568; Y10T 29/49146; Y10T 29/49155
See application file for complete search history.

(56) References Cited

U.S. PATENT DOCUMENTS

| | | | | |
|---|---|---|---|---|
| 8,686,570 | B2 * | 4/2014 | Semmelmeyer | H01L 24/97 257/737 |
| 10,134,711 | B2 * | 11/2018 | Lin | H01L 25/50 |
| 10,930,596 | B2 * | 2/2021 | Guzek | H01L 23/13 |

* cited by examiner

*Primary Examiner* — Donghai D Nguyen
(74) *Attorney, Agent, or Firm* — Studebaker & Brackett PC

(57) ABSTRACT

A method for fabricating an assemble substrate is provided, including stacking a circuit portion on a plurality of circuit members. The circuit members are spaced apart from one another in a current packaging process to increase a layer area. The assemble substrate thus fabricated meets the requirements for a packaging substrate of a large size, and has a high yield and low fabrication cost.

11 Claims, 6 Drawing Sheets

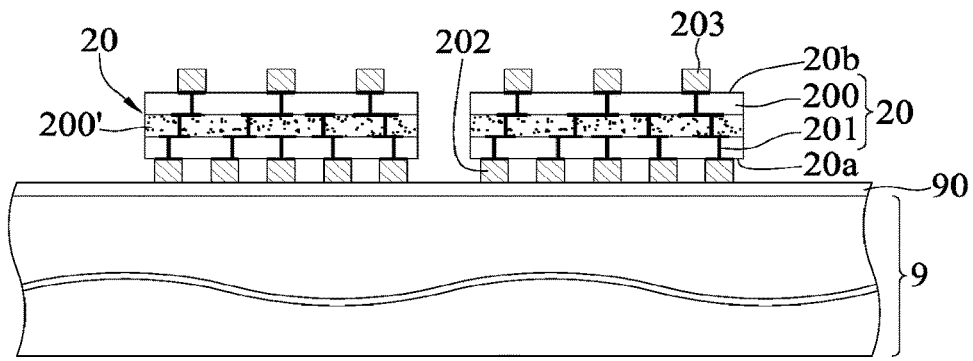
FIG. 2A
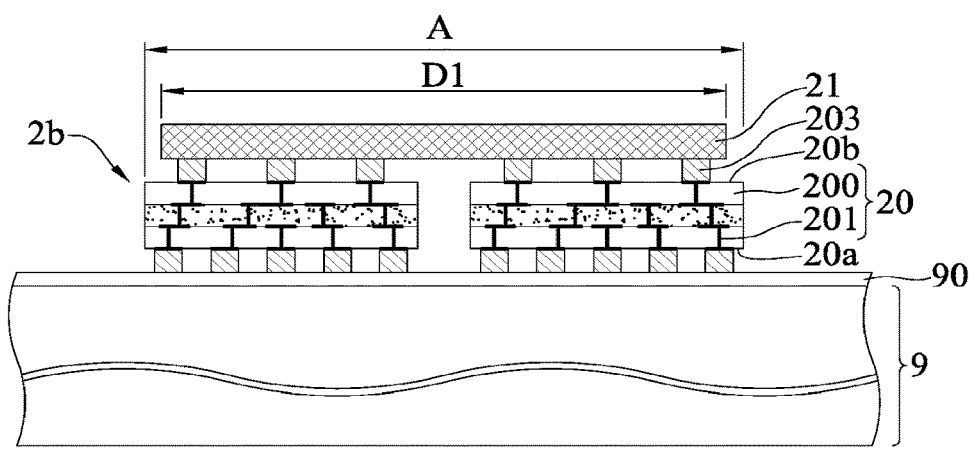
FIG. 2B
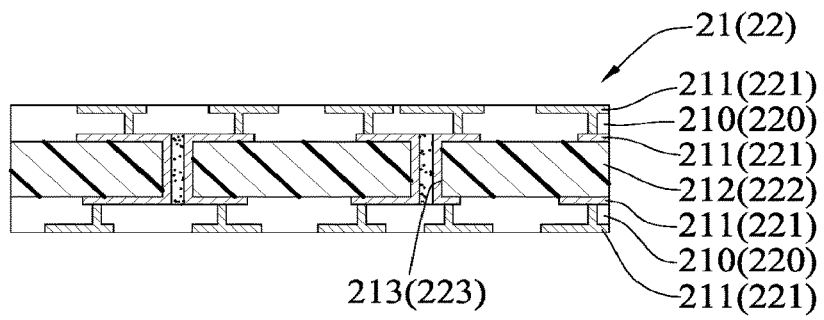
FIG. 2B'
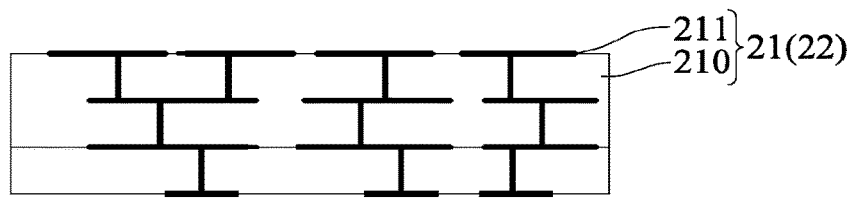
FIG. 2B"

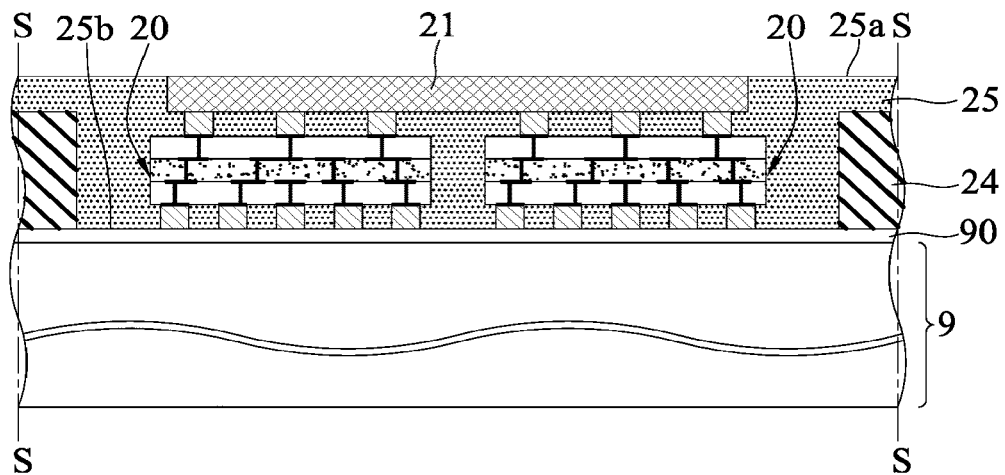
FIG. 2C
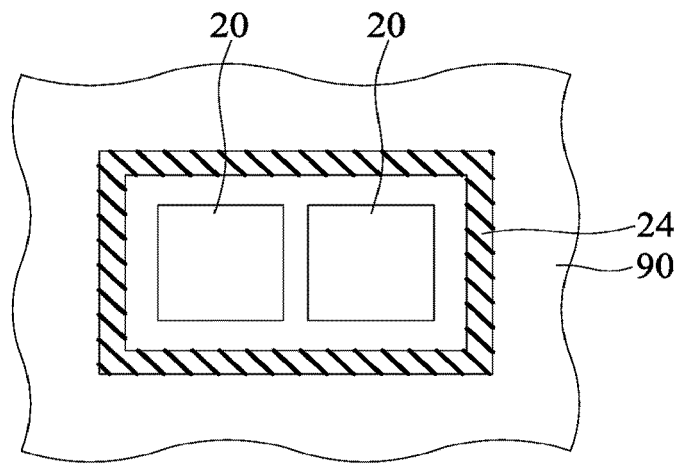
FIG. 2C'
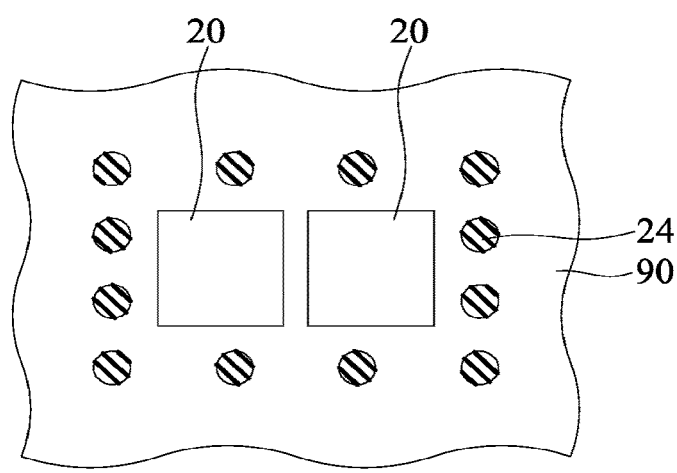
FIG. 2C"

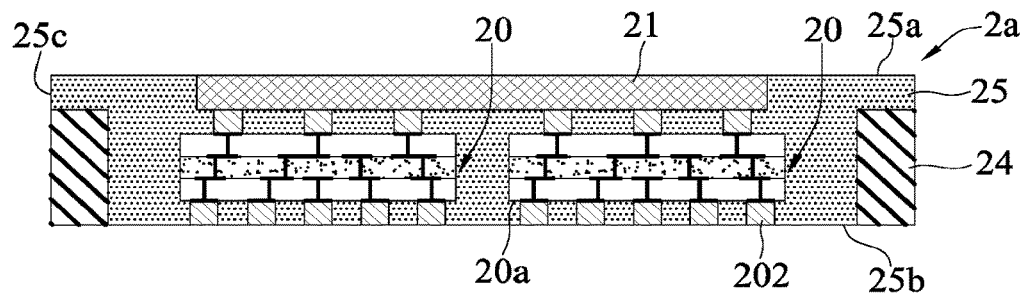
FIG. 2D
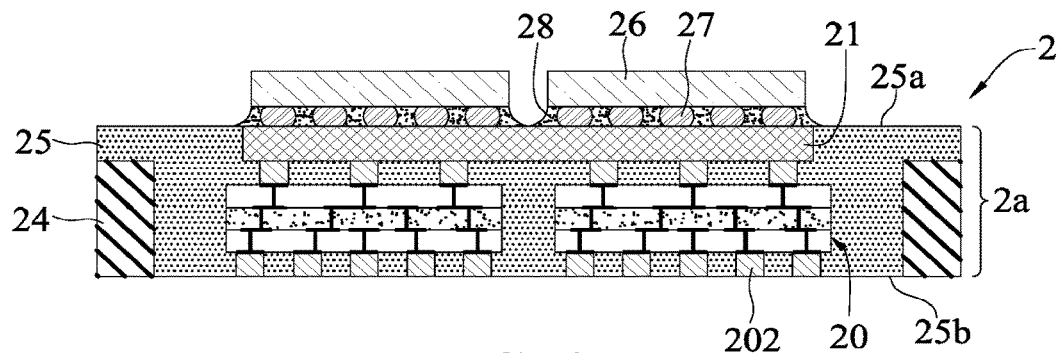
FIG. 2E
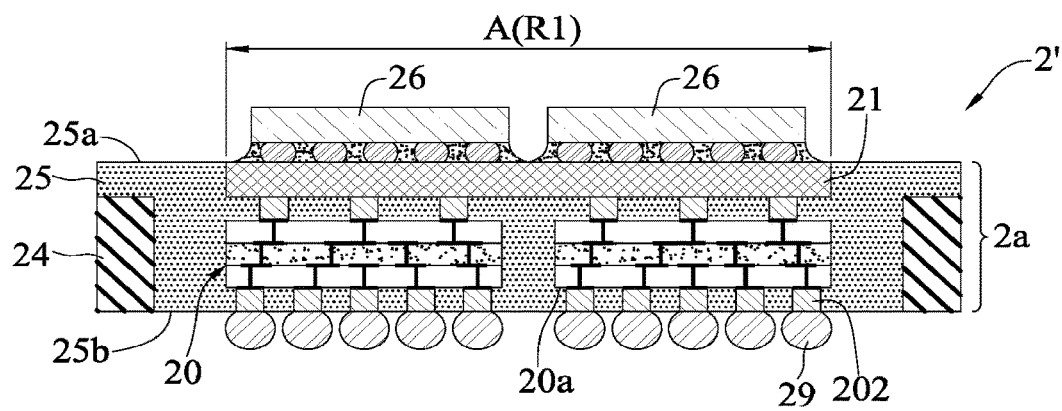
FIG. 2E'
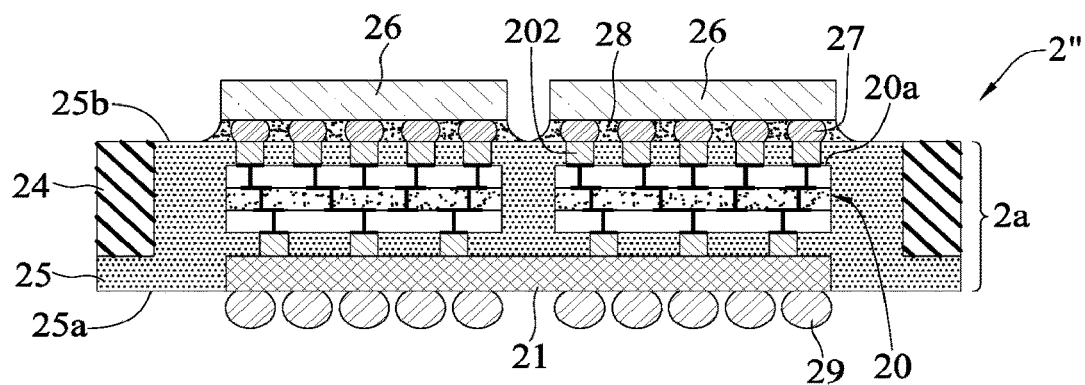
FIG. 2E"

METHOD FOR FABRICATING ASSEMBLE SUBSTRATE

CROSS-REFERENCE TO RELATED APPLICATIONS

This application is a divisional of U.S. application Ser. No. 16/589,663, filed on Oct. 1, 2019, which claims priority to Taiwanese Application Serial No. 108129257, filed on Aug. 16, 2019. The entirety of these applications are incorporated by reference herein and made a part of this specification.

BACKGROUND

1. Technical Field

The present disclosure relates to semiconductor packaging structures and methods for fabricating the same, and, more particularly, to an electronic package, an assemble substrate for the electronic package, and a method for fabricating the assemble substrate.

2. Description of the Prior Art

As technology evolves, electronic products are developed to have various types of components, and multichip module (MCM) and multichip package (MCP) come to the market, which integrate and package a plurality of chips into a single chip. The chip thus fabricated has a great number of I/O pins, increases the operation capability of a processor significantly, reduces the delay time of signal transmission, and can be applied to a high-level product, which has a high circuit density, high transmission speed, a large number of stacked layers, and a large size.

As shown in FIG. 1, in a method for fabricating a multichip packaging structure 1 according to the prior art, a plurality of semiconductor chips 11 are bonded via a plurality of solder bumps 13 to a packaging substrate 10, an underfill 12 is formed between the semiconductor chips 11 and the packaging substrate 10 and encapsulates the solder bumps 13, and a plurality of solder balls 14 are planted on a bottom side of the packaging substrate 10 for being disposed on a circuit board 8 of an electronic product.

The multichip packaging structure 1 does not have satisfied yield for the packaging substrate 10 of a large size, with layout area of 100·100 mm², for example. The single packaging substrate 10 has an extremely high fabrication cost, and is not competitive in the market.

Therefore, how to overcome the drawbacks in the prior art is becoming an urgent issue in the art.

SUMMARY

In view of the drawbacks of the prior art, the present disclosure provides an assemble substrate, comprising: a plurality of circuit members spaced apart from one another; and at least one circuit portion stacked on and electrically connected to the plurality of circuit members, wherein the circuit portion has a first width less than or equal to a second width between two of the plurality of circuit members, with the second width being greater than a width between any other two of the plurality of circuit members.

In an embodiment, the circuit portion is disposed on both sides of the plurality of circuit members.

In an embodiment, the circuit members are stacked on and electrically connected via a plurality of conductive bodies to the circuit portion.

In an embodiment, the assemble substrate further comprises an encapsulation layer encapsulating the plurality of circuit members and the circuit portion. In another embodiment, the assemble substrate further comprises a functional component embedded in the encapsulation layer and surrounding the plurality of circuit members. In yet another embodiment, the functional component is exposed from the encapsulation layer.

In an embodiment, the plurality of circuit members are circuit boards.

In an embodiment, the assemble substrate is stacked on and electrically connected via a plurality of conductive bodies to an electronic component or a conductive element.

The present disclosure further provides a method for fabricating an assemble substrate, comprising: stacking a plurality of circuit members spaced apart from one another and at least one circuit portion on a carrying board, and electrically connecting the circuit portion to the plurality of circuit members, wherein the circuit portion has a first width less than or equal to a second width between two of the plurality of circuit members, with the second width being greater than a width between any other two of the plurality of circuit members; and removing the carrying board.

In an embodiment, the circuit portion is stacked on both sides of the plurality of circuit members.

In an embodiment, the circuit members are stacked on and electrically connected via a plurality of conductive bodies to the circuit portion.

In an embodiment, the method further comprises forming on the carrying board an encapsulation layer encapsulating the plurality of circuit members and the circuit portion. In another embodiment, the circuit members or the circuit portion are exposed from the encapsulation layer. In yet another embodiment, the assemble substrate has both sides exposed from the encapsulation layer and stacked on and electrically connected to via a plurality of conductive bodies an electronic component or a conductive element. In still another embodiment, the method further comprises, prior to forming an encapsulation layer, disposing on the carrying board a functional component surrounding the plurality of circuit members. In a further embodiment, the functional component is exposed from the encapsulation layer.

In an embodiment, the plurality of circuit members and the circuit portion are disposed by: placing the plurality of circuit members on the carrying board; and stacking the circuit portion on the plurality of circuit members.

In an embodiment, the plurality of circuit members and the circuit portion are disposed by: placing the circuit portion on the carrying board; and stacking the plurality of circuit members, with one side thereof, on the circuit portion. In another embodiment, the method further comprises stacking another circuit portion on the other side of the plurality of circuit members.

The present disclosure further provides an electronic package, which comprises: the aforementioned assemble substrate; and an electronic component disposed on one side of the assemble substrate and electrically connected to the assemble substrate.

In an embodiment, the electronic package further comprises a plurality of conductive elements disposed on the other side of the assemble substrate and electrically connected to the assemble substrate.

In the electronic package, the assemble substrate of the electronic package, and the method for fabricating the assemble structure according to the present disclosure, the plurality of circuit members are spaced apart from one another to increase a layout area. Compared to the prior art, the present disclosure meets the requirements for a packaging substrate of a large size, increases the yield, has an extremely low fabrication cost, and is very competitive in the market.

BRIEF DESCRIPTION OF THE DRAWINGS

FIGS. 2A through 2D are cross-sectional views illustrating a method for fabricating an assemble substrate of a first embodiment according to the present disclosure.

FIGS. 2B' and 2B" are cross-sectional views of different aspects of a circuit portion of an assemble substrate according to the present disclosure.

FIGS. 2C' and 2C" are top views of a portion of a different aspect of FIG. 2C.

FIGS. 2E, 2E' and 2E" are cross-sectional views of different aspects of an electronic package according to the present disclosure.

FIG. 3B' is another aspect of FIG. 3B.

DETAILED DESCRIPTION

Figure 1:
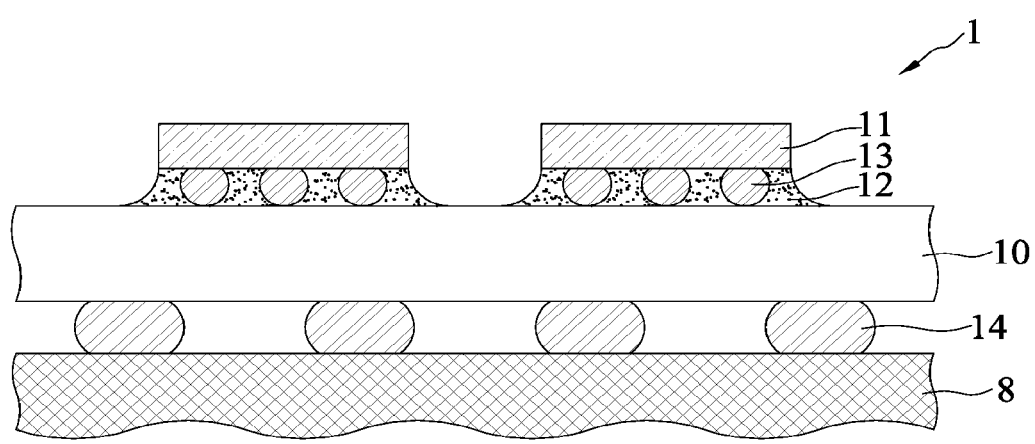
FIG. 1 is a cross-sectional view of a multichip packaging structure according to the prior art.

The following illustrative embodiments are provided to illustrate the disclosure of the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2E are cross-sectional views illustrating a method for fabricating an assemble substrate 2a and an electronic package 2 of a first embodiment according to the present disclosure.

As shown in FIG. 2A, a plurality of circuit members 20 spaced apart from one another are disposed on a carrying board 9. The circuit members 20 are arranged on demands.

In an embodiment, the circuit members 20 are substrates, such as a circuit structure having a core layer or a coreless circuit (a circuit structure having a core layer is shown in the drawings), and have a core layer 200', insulators 200 disposed on two sides of the core layer 200', and a plurality of circuit layers 201 (e.g., fan out redistribution circuit layers (RDL)) bonded to the insulators 200. In an embodiment, the insulators 200 are made of polybenzoxazole (PBO), polyimide (PI), a prepreg (PP), or other dielectric materials. In another embodiment, the circuit members 20 have a through silicon via (TSV) structure. In yet another embodiment, the circuit members 20 are boards having other arranged layouts, such as an organic material, a semiconductor board (silicon), a ceramic board (ceramic), or other carries having metal routings.

The circuit members 20 have a first side 20a and a second side 20b opposing the first side 20a. A plurality of conductive bodies 202 and 203 are bonded and electrically connected to the first side 20a and the second side 20b. In an embodiment, the conductive bodies 202 and 203 are conductive circuits, in the shape of balls, such as solder balls, in the shape of metal pillars, such as copper pillars, solder bumps etc., or stud structures manufactured by a wire bonder.

In an embodiment, the carrying board 9 is a round board made of a semiconductor material, such as silicon or glass. A release layer 90 is formed on the carrying board 9, and conductive bodies 202 disposed on the first sides 20a of the circuit members 20 can be disposed on the release layer 90.

As shown in FIG. 2B, a first circuit portion 21 fabricated in advance is provided and disposed on the second sides 20b of the circuit members 20 via the conductive bodies 203, to form an assemble substrate 2b.

In an embodiment, the first circuit portion 21 is a circuit board, and has at least one first dielectric layer 210 and a first circuit layer 211 disposed on the first dielectric layer 210. As shown in FIG. 2B', the first circuit portion 21 is a substrate having a core layer 212, and is electrically connected to first circuit layers 211 formed on two opposing surfaces of the core layer 212 via conductive vias 213 formed in the core layer 212. As shown in FIG. 2B", the first circuit portion 21 is a coreless circuit structure cheaper than a substrate having a core layer, and is fabricated by a molded interconnect substrate (MIS) process, which costs less than an RDL process. In the RDL process, insulators are fabricated by a soft material, such as polyimide (PI). By contrast, in the MIS process, an insulation material employs a molding compound as insulators. Therefore, a circuit structure formed in the MIS process is stronger than that formed in the RDL process, and can be hanged on the second sides 20b of the circuit members 20 independently. As such, the MIS process is a better choice.

The circuit layers 201 of the circuit members 20 and the first circuit layers 211 of the first circuit portion 21 have the same or different circuit specifications (line width and line pitch).

A first width D1 of the first circuit portion 21 is less than a second width A between two of the plurality of circuit members 20, the second width A is greater than a width between any other two of the plurality of circuit members 20.

As shown in FIG. 2C, an encapsulation layer 25 is formed on the release layer 90 of the carrying board 9 and encapsulates the circuit members 20 and the first circuit portion 21.

In an embodiment, the encapsulation layer 25 is made of an insulation material, such as polyimide (PI), a dry film, an encapsulation resin, such as epoxy resin, or a molding compound. In an embodiment, the encapsulation layer 25 is formed by liquid compound, injection, lamination, compression molding, etc., on the release layer 90.

The encapsulation layer 25 has a first surface 25a and a second surface 25b opposing the first surface 25a. The second surface 25b of the encapsulation layer 25 is bonded to the release layer 90 of the carrying board 9, the first circuit portion 21 is disposed on the first surface 25a of the encapsulation layer 25 correspondingly, and the plurality of circuit members 20 are disposed on the second surface 25b of the encapsulation layer 25 correspondingly.

A leveling process, such as a grinding process, is used to remove a portion of the encapsulation layer 25, or even remove a portion of the first circuit portion 21, allowing the first surface 25a of the encapsulation layer 25 to be flush with a surface of the first circuit portion 21 and a portion of the first circuit layers 211 of the first circuit portion 21 to be exposed from the first surface 25a of the encapsulation layer 25.

Before the encapsulation layer 25 is formed, at least one functional component 24 can be disposed on the carrying board 9 on demands, and the encapsulation layer 25 encapsulates the functional component 24. In an embodiment, the functional component 24 is a heat sink, a stress distributing component (e.g., a metal frame), or other functional structures. In another embodiment, the functional component 24, in the shape of a continuous ring shown in FIG. 2C' or a discontinuous ring shown in FIG. 2C", surrounds a layout area of the circuit members 20.

As shown in FIG. 2D, the carrying board 9 and the release layer 90 thereon are removed to expose the second surface 25b of the encapsulation layer 25 and the conductive bodies 202 on the first side 20a of the circuit members 20. A singulation process is performed along a cutting path S shown in FIG. 2C, to obtain another assemble substrate 2a.

In an embodiment, the functional component 24 is embedded in and exposed from a lateral surface 25c of the encapsulation layer 25.

As shown in FIG. 2E, one or a plurality of electronic components 26 can be disposed on the outermost one of the first circuit layers 211 of the first circuit portion 21 of the assemble substrate 2a, to form an electronic package 2 according to the present disclosure.

In an embodiment, the electronic component 26 is an active element, such as a semiconductor chip, a passive element, such as a resistor, a capacitor and an inductor, or a combination thereof. In another embodiment, the electronic component 26 is a semiconductor chip disposed on the first circuit portion 21 and electrically connected to the first circuit layers 211 in a flip-chip manner via a plurality of conductive bumps 27 made of a solder material, while an underfill 28 encapsulates the conductive bumps 27. In another embodiment, the electronic component 26 is electrically connected to the first circuit portion 21 in a wire bonding manner via a plurality of bonding wires (not shown). In yet another embodiment, the electronic component 26 is electrically connected to the first circuit portion 21 via a conductive material (not shown), such as a conductive resin or a solder material. In still another embodiment, the electronic component 26 is electrically connected to the first circuit portion 21 in other manners.

In a subsequent process, the electronic package 2 is mounted on a packaging structure or an electronic device, such as a circuit board (not shown), via the conductive bodies 202 disposed on one side of the assemble substrate 2a (the first side 20a of the circuit members 20). In another embodiment, the second surface 25b of the encapsulation layer 25 is etched on demands, and the conductive bodies 202 of the circuit members 20 thus protrude from the second surface 25b of the encapsulation layer 25, allowing to be mounted on an electronic device (not shown). In still another embodiment, in an electronic package 2' shown in FIG. 2E', a plurality of conductive elements 29, such as solder balls, are formed on the first side 20a of the circuit members 20 (or the conductive bodies 202), for the electronic package 2' to be mounted via the conductive elements 29 on an electronic device (not shown) in a subsequent process.

In the electronic package 2' shown in FIG. 2E', a first width R1 of the first circuit portion 21 is equal to a second width A between two of the plurality of circuit members 20, and the second width A is greater than a width between any other two of the plurality of circuit members 20.

In electronic package 2" shown in FIG. 2E", the electronic component 26 is mounted on the conductive bodies 202 of the first side 20a of the circuit members 20 of the assemble substrate 2a, and the conductive elements 29 are mounted on the first circuit portion 21.

Figure 3A:
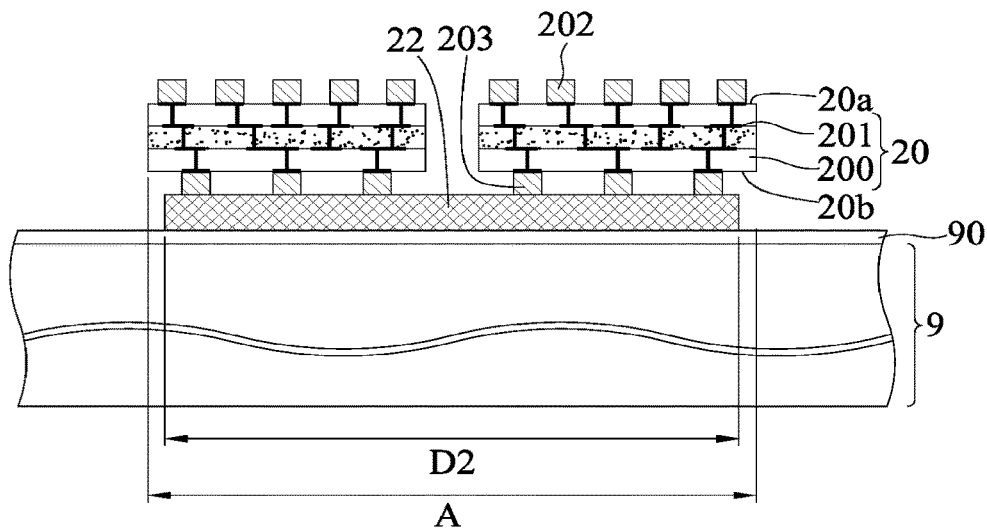
FIGS. 3A and 3B are cross-sectional views illustrating a method for fabricating an assemble substrate of a second embodiment according to the present disclosure.
Figure 3B:
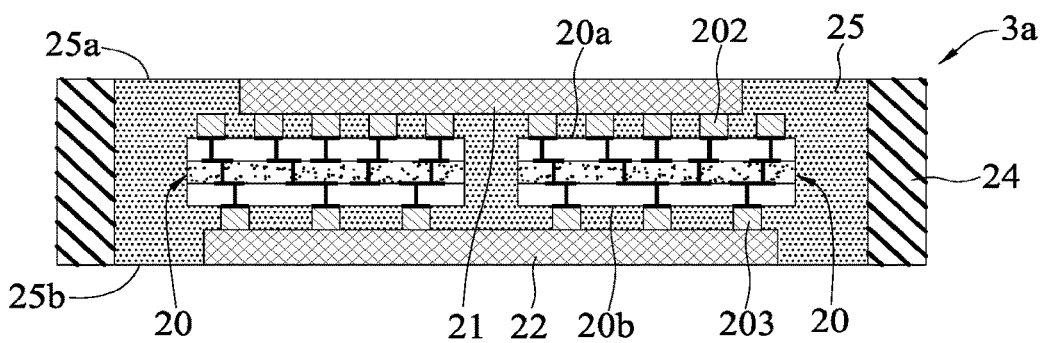
Figure 3B:
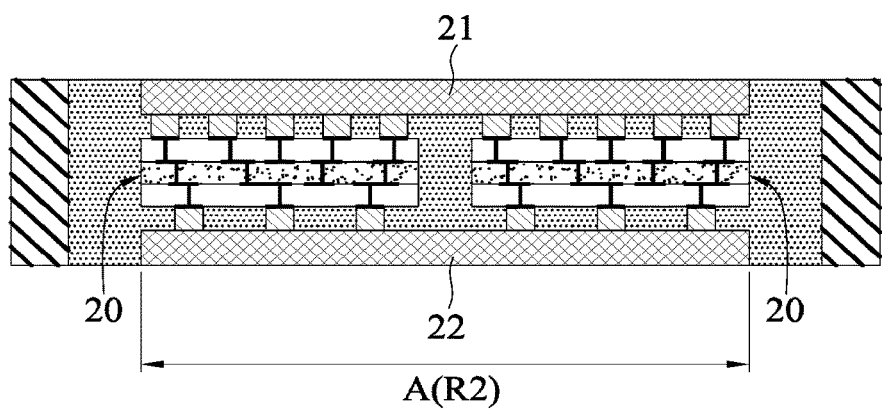

FIGS. 3A and 3B are cross-sectional views illustrating a method for fabricating an assemble substrate 3a of a second embodiment according to the present disclosure. The second embodiment differs from the first embodiment in that another circuit portion is further included in the second embodiment.

As shown in FIG. 3A, a second circuit portion 22 is disposed on the release layer 90 of the carrying board 9, and the conductive bodies 203 of the second sides 20b of the circuit members 20 are disposed on the second circuit portion 22.

In an embodiment, the second circuit portion 22 is a circuit board, and has at least one second dielectric layer 220 and a second circuit layer 221 formed on the second dielectric layer 220, such as a packaging substrate having a core layer 222 and conductive vias 223 shown in FIG. 2B', or a coreless circuit structure shown in FIG. 2B". The second circuit portion 22 and the first circuit portion 21 have the same or different types.

The circuit layers 201 of the circuit members 20 and the second circuit layers 221 of the second circuit portion 22 have the same or different circuit specifications (line width and line pitch).

A first width D2 of the second circuit portion 22 is less than a second width A between two of the plurality of circuit members 20, and the second width A is greater than a width between any other two of the plurality of circuit members 20.

As shown in FIG. 3B, which shows the same processes as those in FIGS. 2B to 2D, a first circuit portion 21 is provided, and an encapsulation layer 25 is formed, to obtain another assemble substrate 3a, in which the first circuit portion 21 and the second circuit portion 22 are stacked via the conductive bodies 202 and 203 on the first side 20a and the second side 20b of the circuit members 20, respectively.

As shown in FIG. 3B', a first width R2 of the second circuit portion 22 is equal to a second width A between two of the plurality of circuit members 20, and the second width A is greater than a width between any other two of the plurality of circuit members 20.

Figure 3C:
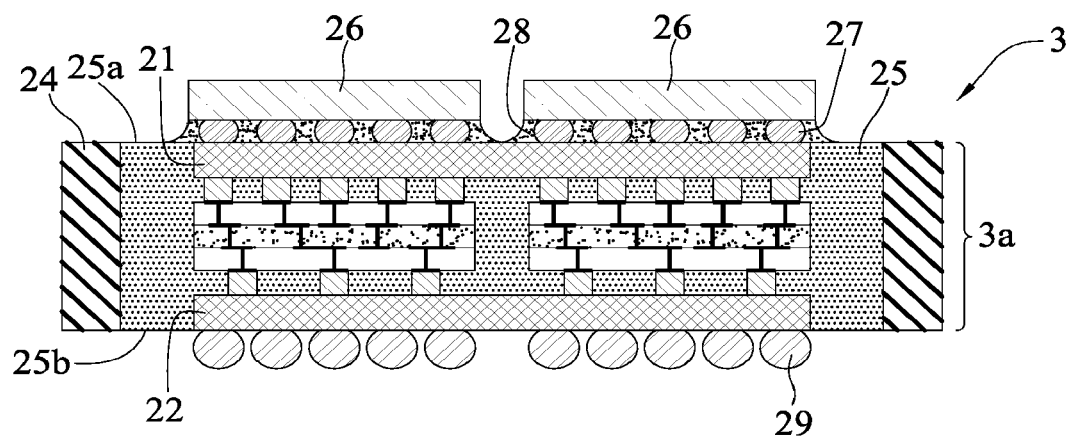
FIG. 3C is a cross-sectional view of another aspect of an electronic package according to the present disclosure.

As shown in FIG. 3C, at least one electronic component 26 is mounted on the outermost one of the first circuit layers 211 of the first circuit portion 21 of the assemble substrate 3a, to form an electronic package 3 according to the present disclosure. In an embodiment, a plurality of conductive elements 29, such as solder balls, are disposed on the second circuit portion 22, and the electronic package 3 is mounted via the conductive elements 29 on an electronic device (not shown) in a subsequent process.

With regard to the assemble substrate 2a formed in the first embodiment and the assemble substrate 3a formed in the second embodiment, if the first circuit portion 21 of the assemble substrate 2a shown in FIG. 2D has a core layer (as shown in FIG. 2B') and a plurality of (e.g., four) first circuit layers 211; if the first and second circuit portions 21 and 22 of the assemble substrate 3a shown in FIG. 3B also have a core layer (as shown in FIG. 2B'). In the assemble substrate 3a, compared to the assemble substrate 2a, a number of the circuit layers can be distributed on demands. For example, the first circuit portion 21 has two first circuit layers 211, and the second circuit portion 22 has two second circuit layers 221, to allow the circuit members 20 to have the same number of layout layers on the first side 20a and the second side 20b. The circuit board thus has a reduced fabrication cost since each of the circuit portion has fewer layers. Moreover, if the first and second circuit portions 21 and 22 of the assemble substrate 3a shown in FIG. 3B have a coreless structure (as shown in FIG. 2B"); if the circuit portion 21 of the assemble substrate 2a shown in FIG. 2D has a coreless structure (as shown in FIG. 2B"). In the assemble substrate 2a, more layers of circuit layers will be formed on one side of the circuit members 2 (the second side 20b). As a result, the assemble substrate 2a is likely warped. By contrast, in the assemble substrate 3a shown in FIG. 3B, a number of circuit layers are distributed on demands, and the same number of layout layers are disposed on the first side 20a and the second side 20b of the circuit members 20, respectively. Such the assemble substrate 3a is less likely warped.

Figure 4:
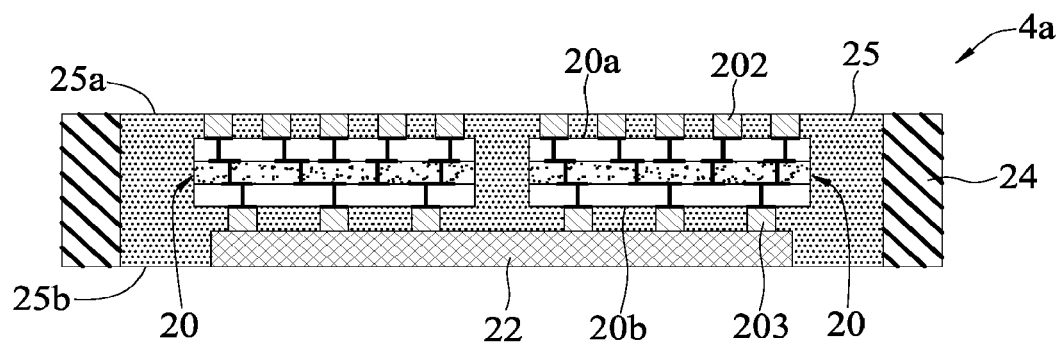
FIG. 4 is a cross-sectional view illustrating a method for fabricating an assemble substrate of a third embodiment according to the present disclosure.

In an assemble substrate 4a shown in FIG. 4, which is fabricated according to the method of the second embodiment (e.g., shown in FIG. 3A), the first circuit portion 21 on the conductive bodies 202 on the first side 20a of the circuit members 20 are omitted on demands, to form an assemble substrate similar to the assemble substrate 2a shown in FIG. 2D.

In a method for fabricating an electronic package according to the present disclosure, a plurality of circuit members 20 and a circuit portion constitute a substrate of a large size (the assemble substrates 2a, 2b, 3a and 4a), to reduce the fabrication cost significantly.

A first circuit portion 21 of at least one less number of (e.g., one to four) layout layers act as a connection member of the circuit members 20 and electronic component 26 and/or the conductive elements 29, to reduce the fabrication cost of a substrate. Through the arrangement of upper and lower circuit portions (the first circuit portion 21 and the second circuit portion 22), the number of layout layers of each of the circuit portions can be reduced by half, and the fabrication cost of a substrate is reduced.

In the second embodiment, the coreless circuit structure shown in FIG. 2B" is fabricated in the MIS process, and will have a strong structure and be hard enough for the first circuit portion 21 be disposed over the circuit members 20 before the encapsulation layer 25 is formed.

The present disclosure also provides an electronic package 2, 2', 2", 3, which comprises an assemble substrate 2a, 2b, 3a, 4a, at least one electronic component 26, and a plurality of conductive elements 29. The assemble substrate 2a, 2b, 3a, 4a comprises a plurality of circuit members 20 and a circuit portion (the first circuit portion 21 and/or the second circuit portion 22) stacked on the plurality of circuit members 20. In an embodiment, the first circuit portion 21 and the second circuit portion 22 are disposed on two opposing sides of the plurality of circuit members 20, respectively. The assemble substrate 2a, 3a, 4a further comprises an encapsulation layer 25 encapsulating the plurality of circuit members 20 and the circuit portion (the first circuit portion 21 and/or the second circuit portion 22).

The encapsulation layer 25 has a first surface 25a and a second surface 25b opposing the first surface 25a.

The circuit members 20 are disposed horizontally, spaced apart from one another, embedded in the encapsulation layer 25, and electrically connected to the first circuit portion 21.

The first circuit portion 21 is embedded in the encapsulation layer 25, is disposed on the first surface 25a of the encapsulation layer 25 correspondingly, and is closer than the plurality of circuit members 20 to the first surface 25a of the encapsulation layer 25.

The second circuit portion 22 is embedded in the encapsulation layer 25, is disposed on the second surface 25b of the encapsulation layer 25 correspondingly, and is closer than the plurality of circuit members 20 to the second surface 25b of the encapsulation layer 25.

The electronic component 26 is disposed on one side of the assemble substrate 2a, 3a, 4a, such as the first surface 25a or the second surface 25b of the encapsulation layer 25.

The conductive elements 29 are disposed on the other side of the assemble substrate 2a, 3a, 4a, such as the first surface 25a or the second surface 25b of the encapsulation layer 25.

In an embodiment, the plurality of circuit members 20 are circuit boards.

In an embodiment, the circuit members 20 are stacked on and electrically connected via a plurality of conductive bodies 202, 203 to the circuit portion (the first circuit portion 21 and/or the second circuit portion 22).

In an embodiment, the assemble substrate 2a, 3a, 4a further comprises a functional component 24 embedded in the encapsulation layer 25 and surrounding the circuit members 20. In an embodiment, the functional component 24 is exposed from the encapsulation layer 25.

In the electronic package, the assemble substrate of the electronic package, and the method for fabricating the assemble structure according to the present disclosure, the plurality of circuit members are spaced apart from one another, to increase a layout area. Compared to the prior art, the present disclosure meets the requirements for a packaging substrate of a large size, increases the yield, has an extremely low fabrication cost, and is very competitive in the market.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A method for fabricating an assemble substrate, comprising:
   providing a plurality of circuit members and at least one circuit portion on a carrying board, and electrically connecting the circuit portion to the plurality of circuit members, wherein the plurality of circuit members are spaced apart from one another, wherein the circuit portion is stacked on two of the plurality of circuit members, wherein the circuit portion and the plurality of circuit members are circuit boards, and wherein the circuit portion has a first width less than or equal to a second width between two of the plurality of circuit members, with the second width being greater than a width between any other two of the plurality of circuit members; and removing the carrying board.

2. The method of claim 1, wherein the circuit portion is staked on both sides of the plurality of circuit members.

3. The method of claim 1, further comprising providing a plurality of conductive bodies, via which the circuit members are stacked on and electrically connected to the circuit portion.

4. The method of claim 1, further comprising forming on the carrying board an encapsulation layer encapsulating the plurality of circuit members and the circuit portion.

5. The method of claim 4, wherein the circuit members or the circuit portion are exposed from the encapsulation layer.

6. The method of claim 4, wherein the assemble substrate has both opposing sides exposed from the encapsulation layer and stacked on and electrically connected to via a plurality of conductive bodies an electronic component or a conductive element.

7. The method of claim 4, further comprising, prior to forming the encapsulation layer, disposing on the carrying board a functional component surrounding the plurality of circuit members.

8. The method of claim 7, wherein the functional component is exposed from the encapsulation layer.

9. The method of claim 1, wherein the plurality of circuit members and the circuit portion are disposed by:
    placing the plurality of circuit members on the carrying board; and
    stacking the circuit portion on the plurality of circuit members.

10. The method of claim 1, wherein the plurality of circuit members and the circuit portion are disposed by:
    placing the circuit portion on the carrying board; and
    stacking the plurality of circuit members, with one side thereof, on the circuit portion.

11. The method of claim 10, further comprising stacking another circuit portion on the other side of the plurality of circuit members.

* * * * *